(12) United States Patent
Braithwaite

(10) Patent No.: US 7,123,086 B2
(45) Date of Patent: Oct. 17, 2006

(54) FEED FORWARD AMPLIFIER EMPLOYING POSITIVE FEEDBACK PILOT GENERATION

(75) Inventor: Richard Neil Braithwaite, Orange, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 59 days.

(21) Appl. No.: 10/838,985

(22) Filed: May 5, 2004

(65) Prior Publication Data

US 2004/0251961 A1  Dec. 16, 2004

Related U.S. Application Data

(60) Provisional application No. 60/468,444, filed on May 7, 2003.

(51) Int. Cl.
*H03F 3/66* (2006.01)

(52) U.S. Cl. ......................................... 330/52; 330/149

(58) Field of Classification Search ................. 330/52, 330/149, 151, 140; 375/297
See application file for complete search history.

(56) References Cited

U.S. PATENT DOCUMENTS

| | | | |
|---|---|---|---|
| 2,231,542 A | | 2/1941 | Mallinckrodt |
| 2,231,558 A | | 2/1941 | Bollman |
| 2,280,293 A | | 4/1942 | Kreer, Jr. |
| 3,872,394 A | | 3/1975 | Bartenstein |
| 4,320,348 A | | 3/1982 | Suzuki et al. |
| 4,876,741 A | | 10/1989 | Jacobs et al. |
| 5,095,394 A | * | 3/1992 | Yanagihara .............. 360/77.14 |
| 5,515,000 A | | 5/1996 | Maruyama et al. |
| 5,594,385 A | | 1/1997 | Anvari |
| 5,621,354 A | | 4/1997 | Mitzlaff |
| 5,644,268 A | * | 7/1997 | Hang ......................... 330/151 |
| 5,796,304 A | | 8/1998 | Gentzler |
| 5,809,061 A | | 9/1998 | Shea et al. |
| 5,838,733 A | | 11/1998 | Bruckert |
| 5,847,603 A | | 12/1998 | Myer |
| 5,923,214 A | * | 7/1999 | Mitzlaff ....................... 330/52 |
| 5,986,499 A | * | 11/1999 | Myer .......................... 330/52 |
| 6,052,023 A | | 4/2000 | Myer |
| 6,147,555 A | | 11/2000 | Posner et al. |
| 6,160,996 A | | 12/2000 | Blodgett et al. |
| 6,166,600 A | | 12/2000 | Myer |
| 6,166,601 A | | 12/2000 | Shalom et al. |
| 6,275,106 B1 | | 8/2001 | Gomez |

(Continued)

*Primary Examiner*—Henry Choe
(74) *Attorney, Agent, or Firm*—David L. Henty; Myers Dawes Andras & Sherman

(57) ABSTRACT

A pilot generation and detection system within a feed forward power amplifier that uses positive feedback to create a narrow bandwidth limit cycle is disclosed. The pilot system adjusts its frequency automatically to keep a desirable phase relationship between the pilot generation and detection. As a result, quadrature modulation/detection of the pilot used in prior approaches to ensure reliable estimates of the detected pilot power is unnecessary. This reduces the cost of the system. In addition, the pilot system turns the pilot amplitude 'on' or 'off' as needed. When the alignment of the second loop is good, the positive feedback will not have sufficient gain to maintain a limit cycle. As a result, the pilot will turn off when the second loop has converged. The pilot will return automatically as a by-product of the positive feedback if the second loop alignment degrades. Turning off the pilot when the second loop has converged reduces the pilot spurs appearing at the output of the feed forward amplifier. In addition, turning off the pilot reduces the power in the error amplifier, which in turn, allows the transistor size to be reduced.

38 Claims, 3 Drawing Sheets

U.S. PATENT DOCUMENTS

| | | |
|---|---|---|
| 6,340,915 B1 | 1/2002 | Blodgett |
| 6,388,515 B1 * | 5/2002 | Nishida .................. 330/52 |
| 6,429,738 B1 | 8/2002 | Kenington |
| 6,452,446 B1 | 9/2002 | Eisenberg et al. |
| 6,496,062 B1 | 12/2002 | Nitz et al. |
| 6,553,211 B1 | 4/2003 | Zhou |
| 6,836,671 B1 | 12/2004 | Haigh et al. ............. 455/561 |
| 6,897,723 B1 * | 5/2005 | Gentzler .................. 330/151 |
| 2002/0131522 A1 | 9/2002 | Felgentreff ............... 375/296 |

* cited by examiner

FEED FORWARD AMPLIFIER EMPLOYING POSITIVE FEEDBACK PILOT GENERATION

RELATED APPLICATION INFORMATION

The present application claims the benefit of provisional application Ser. No. 60/468,444 filed May 7, 2003, the disclosure of which is incorporated herein by reference in its entirety.

BACKGROUND OF THE INVENTION

1. Field of the Invention

The present invention relates to RF power amplifiers and amplification methods. More particularly, the present invention relates to feed forward power amplifiers and methods of using a pilot to align the loops of a feed forward amplifier.

2. Description of the Prior Art and Related Information

A primary goal of RF power amplifier design is linearity over the range of power operation. Linearity is simply the ability to amplify without distortion. This requirement is critical for modern wireless communication systems but it is increasingly difficult to achieve. This is due primarily to the bandwidth requirements of modern wireless communication systems which are placing increasing demands on amplifier linearity. Feed forward compensation is a well known approach applied to amplifiers to improve linearity by estimating and canceling distortion. In feed forward RF power amplifiers an error amplifier is employed to amplify only distortion components which are then combined with the main amplifier output to cancel the main amplifier distortion component.

FIG. 1 illustrates a conventional feed forward amplifier design having a main amplifier 1 and an error amplifier 2. The basic elements also include delays 3, 4 in the main and error path, respectively, and main to error path couplers 5, 6, 7 and 8. Additional elements not shown are also typically present in a conventional feed forward architecture as is well known to those skilled in the art. The delays, couplers and error amplifier are designed to extract distortion components from the main path and inject out of phase distortion components from the error path into the main amplifier output at coupler 8 to substantially eliminate the distortion component in the main amplifier path.

The performance of a feed forward amplifier may typically be analyzed based on two cancellation loops. Loop 1, called the carrier cancellation loop, ideally provides a signal at the output of coupler 7 with the input RF carrier component cancelled and only a distortion component remaining. Loop 2 is referred to as the error cancellation loop or auxiliary path loop. In loop 2 the distortion component provided from coupler 7 is amplified by the error amplifier 2 and injected at coupler 8 to cancel the distortion component in the main path and ideally provide a distortion free signal at the output.

The quality of the distortion estimate (carrier cancellation) is determined by the alignment of the first loop in terms of gain and phase. The distortion cancellation in turn is determined by the alignment of the second loop in terms of gain and phase. In prior art systems, a pilot 9 is injected into the main amplifier path of the first loop, acting like a known distortion signal. The pilot signal is detected at the feed forward amplifier output by a pilot detector 10 and used to aid the alignment process for the second loop. When the second loop is aligned, the pilot is cancelled. If the second loop is misaligned, residual pilot power will be detected at the output of the feed forward amplifier. The degree of the misalignment is estimated from the measured power of the residual pilot. The alignment of the second loop is adjusted in an iterative manner with the goal of reducing the residual pilot power. The estimate of the pilot power must be reliable in order to determine if a given change in the gain and/or phase alignment represents an improvement.

Prior art pilot generation and detection systems must contend with various problems. First, there is a phase offset between the circuitry modulating and demodulating the pilot. As a result, it is necessary to compute the quadrature terms of the detected pilot in order to obtain a reliable estimate of the pilot power. Second, the pilot is 'always on' in order to measure the second loop alignment, even when the second loop is almost aligned fully. As a result, the residual pilot can appear at the output of the feed forward amplifier as a spectral spur. Third, the pilot power consumes part of the rated power handling capability of the main and error amplifiers. As a result, larger transistors are required to meet customer specifications, which in turn increases the cost.

In the prior art, the quadrature terms are obtained using two general approaches. The first approach generates a pilot tone without modulation and uses quadrature detection. The second approach modulates the pilot tone with quadrature components and uses scalar detection. In this approach the quadrature components are time-multiplexed to produce two independent measurements at the detector. The quadrature terms are then squared and added to obtain the pilot power. In general, the quadrature requirement adds expense and complexity to the pilot generation or detection circuitry, and adds complexity to the post-detector digital processing.

The residual pilot is considered to be an unwanted spectral emission from the feed forward amplifier. It must be limited when the amplifier is in an operational mode, after the second loop alignment has converged sufficiently to meet customer specifications. For prior art approaches, the amount of pilot power injected into the main amplifier path is therefore limited to prevent excessive residual spurs. This makes the detection circuitry more susceptible to noise, making the alignment process for the second loop less robust.

In the prior art, the pilot power consumes part of the power rating of the main and error amplifiers. In general, the power rating of the amplifier is determined primarily by linearity requirements rather than device failure. That is, the presence of the pilot power affects the amount of distortion produced rather than damaging the transistor. As a result, it would be desirable to reduce or turn off the pilot signal when the second loop is aligned fully or at least sufficiently to meet the spectral mask requirements. In addition to improving the power handling capability, turning off the pilot reduces the residual pilot spur appearing at the output. The problem with turning off the pilot is that subsequent misalignments in the second loop cannot be detected. This would make the amplifier very susceptible to thermally induced drift in the second loop gain or phase.

Accordingly, a need exists for a pilot generation and detection system which solves the above-mentioned problems in a simple, inexpensive, and effective manner.

SUMMARY OF THE INVENTION

In a first aspect the present invention provides a feed forward amplifier comprising an RF input for receiving an RF signal, a main amplifier which receives and amplifies the RF signal and a main amplifier output sampling coupler. A first delay is also coupled to the RF input and provides a delayed RF signal and a carrier cancellation combiner couples the delayed RF signal to the sampled output from the main amplifier. An error amplifier receives and amplifies the output of the carrier cancellation combiner. A second delay is coupled to the output of the main amplifier and an error injection coupler combines the output from the error amplifier and the delayed main amplifier output from the second delay so as to cancel distortion introduced by the main amplifier. An RF output is coupled to the error injection coupler output and provides an amplified RF signal. An output sampling coupler provides a sampled output of the amplified RF signal. A positive feedback pilot generator circuit generates a pilot signal from the sampled output of the amplified RF signal and provides the pilot signal to the input of the main amplifier.

In a preferred embodiment of the feed forward amplifier the positive feedback pilot generator circuit comprises a bandpass power detector for detecting signal components other than the RF input signal and a pilot generator circuit coupled to the bandpass power detector. A local oscillator is coupled to the bandpass power detector and the pilot generator circuit. The bandpass power detector preferably comprises a first multiplier coupled to the local oscillator and a first filter coupled to the output of the multiplier. The pilot generator circuit preferably comprises a limiter coupled to an output of the bandpass power detector and a second multiplier, coupled to the local oscillator, which receives the output of the limiter, wherein the output of the second multiplier is provided as the pilot signal. The bandpass power detector preferably further comprises a power detector circuit for detecting the power of the signal output from the first filter and provides the detected power as a pilot power signal. The power detector circuit may be a log detector circuit or an RMS detector circuit. The feed forward amplifier may further comprise a controller and the detected pilot power signal is provided to the controller. A phase adjuster and a gain adjuster are preferably coupled between the carrier cancellation combiner and the error amplifier, and the controller controls the gain or phase adjuster based on the pilot power signal. A predistortion circuit may be coupled between the RF input and the main amplifier.

In another aspect the present invention provides a pilot detection and generation system adapted for use with an RF amplifier having an output. The pilot detection and generation system comprises a bandpass power detector circuit for detecting a signal component representative of a band limited portion of the amplifier output and deriving a signal representative of the detected signal power. A pilot generator circuit is coupled to the bandpass power detector circuit and generates a pilot signal from the detected signal component representative of a band limited portion of the amplifier output.

In a preferred embodiment the pilot detection and generation system comprises a local oscillator coupled to the bandpass power detector circuit and the pilot generator circuit. The bandpass power detector circuit preferably comprises a multiplier coupled to the local oscillator so as to mix a sample of the amplifier output and the local oscillator signal. The bandpass power detector circuit also further comprises a bandpass filter coupled to the multiplier which provides a band limited output signal representative of the sampled amplifier output. The bandpass power detector circuit also further comprises a signal power detector coupled to the multiplier which receives the band limited output and provides a signal representative of uncancelled pilot power in the amplifier output. The power detector circuit may be a log detector or an RMS detector. The pilot generator circuit receives the output from the bandpass filter in the bandpass power detector circuit. The pilot generator circuit may further comprise a multiplier coupled to the local oscillator which mixes the local oscillator signal with the band limited signal and provides the output of the multiplier as the pilot signal. The bandpass power detector circuit may further comprise one or more gain stages to provide a gain to the signal from the multiplier. The gain stage(s) may be provided before the bandpass filter and/or after the bandpass filter. The pilot generator circuit may also comprise one or more gain stages to provide a gain to the signal received from the bandpass power detector circuit. The pilot generator circuit may also further comprise a bandpass filter. The gain stage(s) may be configured before the bandpass filter and/or after the bandpass filter. The pilot generator circuit preferably also comprises a limit circuit for limiting the maximum signal strength of the pilot signal.

In another aspect the present invention provides a method for generating a pilot signal from the output of an RF amplifier. The method comprises detecting a signal representative of a band limited sample of an amplifier output and generating a pilot signal derived from the signal representative of a band limited sample of the amplifier output.

In a preferred embodiment of the method, detecting a signal representative of a band limited sample of an amplifier output comprises sampling an RF output signal from the amplifier and down converting the output signal to an intermediate frequency. The down converting may comprise mixing the sampled RF output signal with a local oscillator signal. The down converted signal is preferably band limited to a frequency band outside the frequency band of the down-converted RF carrier signal in the amplifier output. The band limited signal may also be amplified. The power of the band limited signal is then detected. Generating a pilot signal preferably comprises providing a gain to the signal representative of a band limited sample of the amplifier output. The gain adjusted signal is preferably clipped and bandpass filtered. The bandpass filtered signal may also be further gain adjusted. The bandpass filtered signal is then mixed with a local oscillator signal.

In another aspect the present invention provides a method of controlling an amplifier. The method comprises sampling an output of the amplifier, bandpass filtering the sampled signal to provide a band limited signal, generating a pilot signal derived from the band limited signal and injecting the pilot signal into a signal path of the amplifier. Any residual pilot signal in the sampled signal is detected and at least one of the gain and phase of a signal path in the amplifier is controlled in response to the detected pilot signal.

In another aspect the present invention provides a method for amplifying an RF input signal having an RF carrier with a carrier bandwidth. The method comprises receiving an RF input signal, amplifying the RF input signal employing a main amplifier, and sampling the main amplifier output. The method also comprises delaying the RF input signal and providing a delayed RF input signal. The delayed RF input signal is coupled to the sampled output from the main amplifier so as to provide a distortion component of the sampled output from the main amplifier and the distortion component is amplified employing an error amplifier. The output of the main amplifier is delayed and the amplified distortion component and the delayed output of the main amplifier are combined so as to cancel distortion introduced by the main amplifier to provide an amplified RF output. The amplified RF output is sampled to provide a sampled output and the sampled output is band limited to a frequency band outside the RF carrier band. A pilot signal is generated from the band limited signal and the pilot signal is injected as an input to the main amplifier. Any residual pilot signal in the sampled output is detected and used for controlling at least one of the gain or phase of the signal input to the error amplifier.

Further aspects of the invention will be appreciated from the following detailed description of the invention.

DETAILED DESCRIPTION OF THE INVENTION

Figure 1:
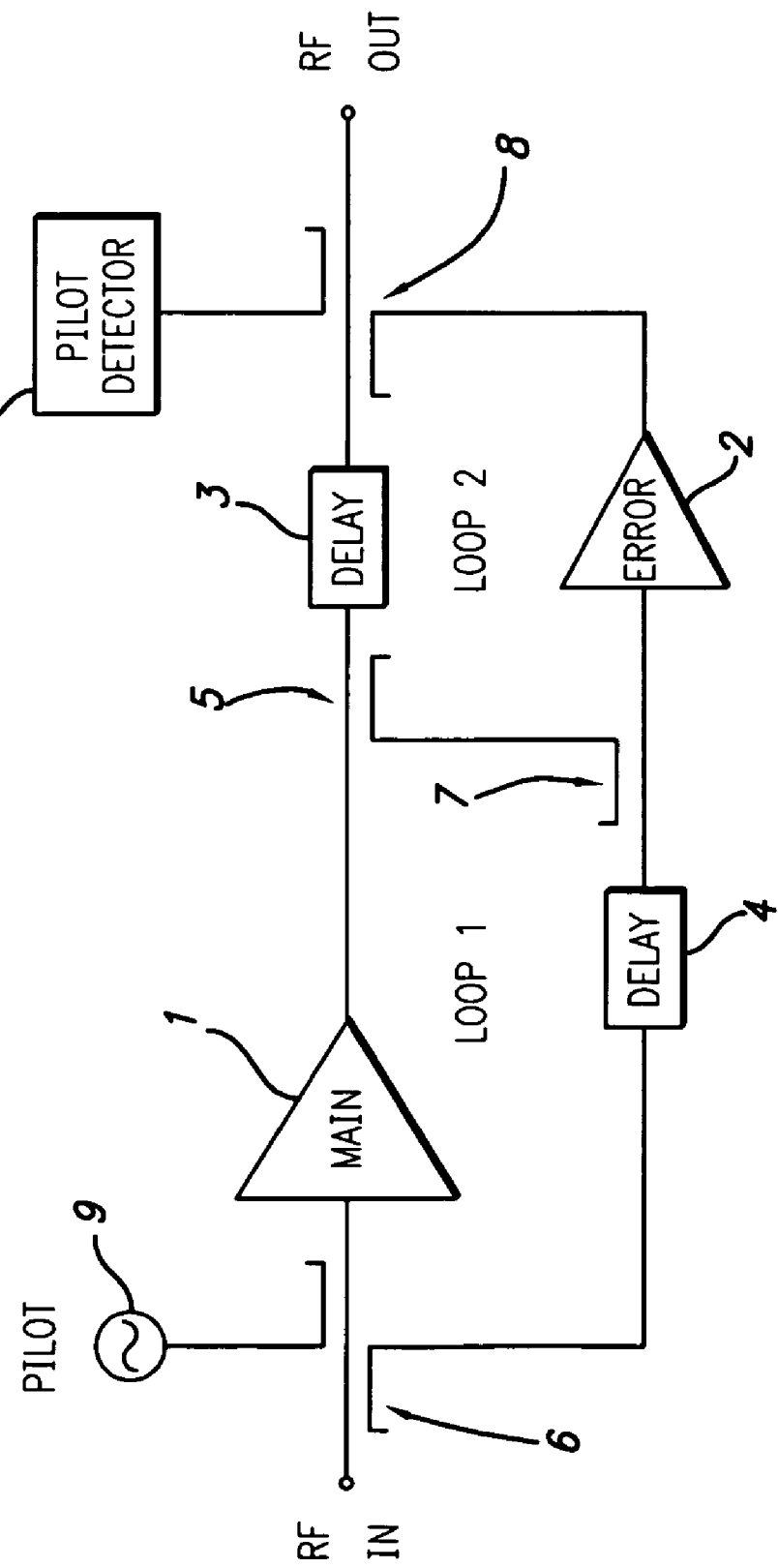
FIG. 1 is a block schematic drawing of a prior art feed forward amplifier.
Figure 2:
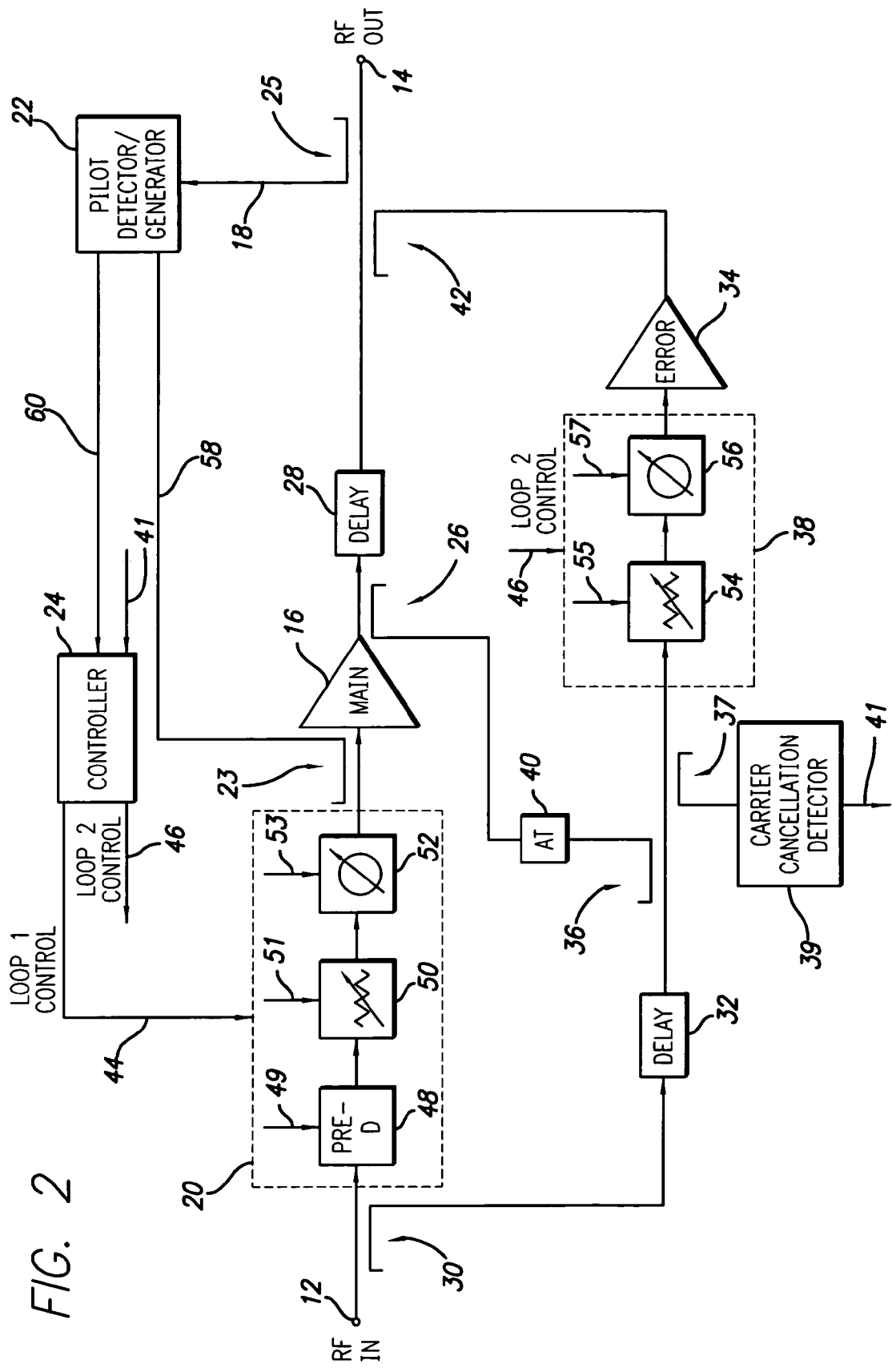
FIG. 2 is a block schematic drawing of a feed forward amplifier employing a positive feedback pilot generation system in accordance with the present invention.
Figure 3:
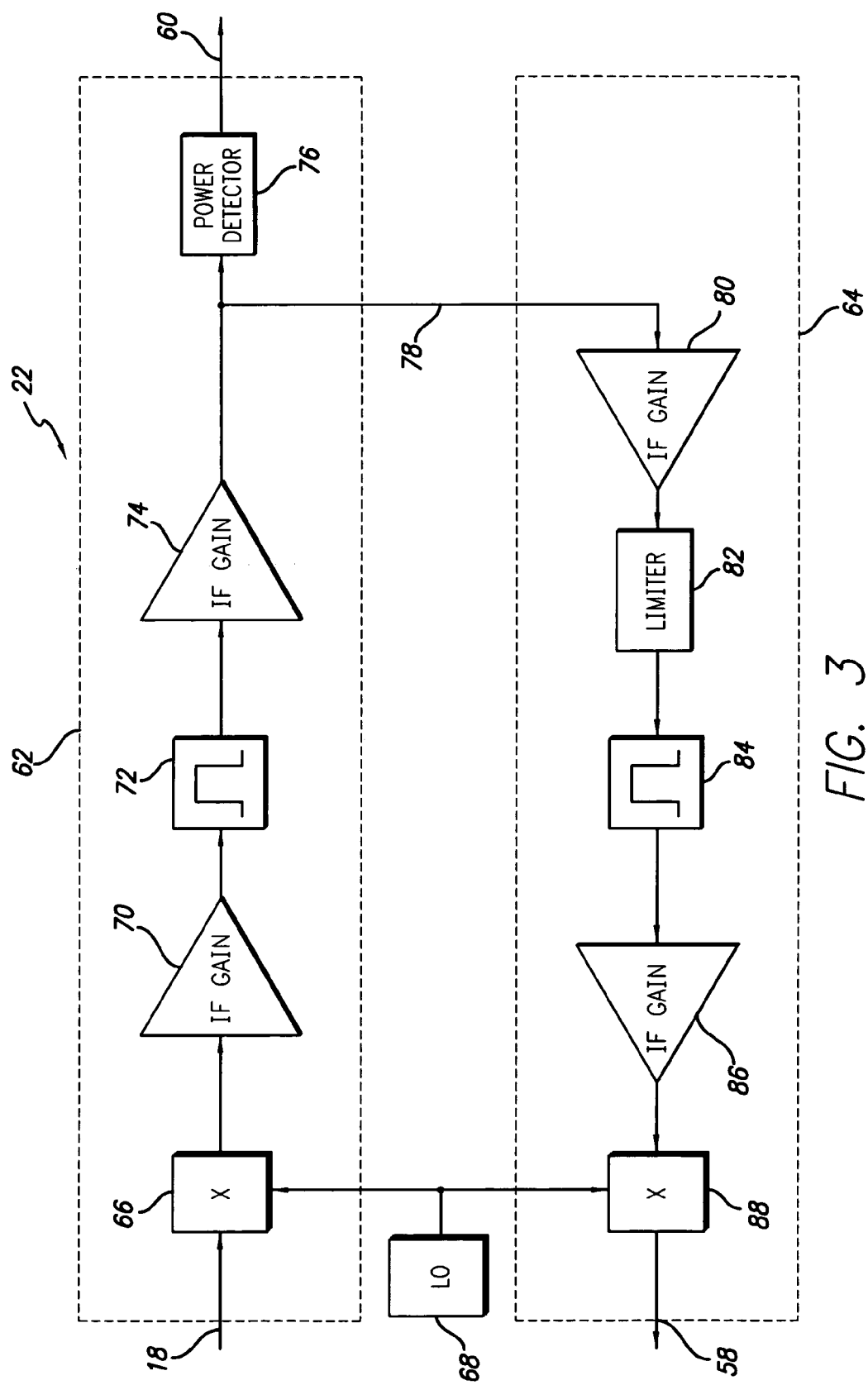
FIG. 3 is a block schematic drawing of a positive feedback pilot generation system employed in the feed forward amplifier of FIG. 2.

A feed forward amplifier in accordance with a preferred embodiment of the present invention is shown in FIG. 2 in a block schematic drawing. The feed forward amplifier employs a positive feedback pilot generation system, a preferred embodiment of which is shown in FIG. 3. The feed forward amplifier of the present invention may incorporate known features other than the novel aspects described in detail herein and such known features will not be described in detail. For example, additional features of a feed forward amplifier architecture and control system are described in U.S. patent application Ser. No. 10/365,111 filed Feb. 12, 2003, the disclosure of which is incorporated herein by reference in its entirety.

Referring to FIG. 2, the feed forward amplifier includes an input 12 which receives an input RF signal to be amplified and an output 14 which outputs the amplified RF signal. The RF signal may be a high bandwidth signal such as a CDMA (Code Division Multiple Access) spread spectrum communication signal or WCDMA (Wide Code Division Multiple Access) signal or other RF signal. The input RF signal is split into a main amplifier signal path and an error amplifier signal path at input coupler 30 in accordance with well known feed forward amplifier design. The main amplifier signal path includes main amplifier 16. The main amplifier signal path further includes input and pre-distortion circuitry 20. The input circuitry may include conventional preamplifier and group delay circuitry (not shown), and gain and phase control circuitry 50, 52, respectively, implemented in accordance with conventional feed forward design. The pre-distortion circuitry 48 in turn pre-distorts the input signal to reduce IMDs introduced by main amplifier 16 and may be optional in some implementations. Input and predistortion circuitry 20 is controlled by loop 1 control signals 44 provided from controller 24. In particular, these control signals include predistortion control signals 49, gain adjuster settings 51 and phase adjuster settings 53.

A positive feedback pilot generation circuit 22 (described in detail in relation to FIG. 3 below) provides a pilot signal 58 which is injected into the main amplifier input at pilot injection coupler 23 as illustrated and is used to control loop 2 alignment (as described below). The pilot signal is extracted at the amplifier output by pilot sampling coupler 25 and detected by circuit 22 and the detected pilot signal 60 is used by controller 24 to provide the loop control to minimize the pilot signal in the output signal and thereby minimize distortion in the output signal (as described in more detail below). The main amplifier signal path further includes a main amplifier output sampling coupler 26 and delay 28, generally in accordance with conventional feed forward design.

Still referring to FIG. 2, the error amplifier signal path includes input signal coupler 30 which samples the RF input signal and provides it to the error amplifier 34 via delay 32, carrier cancellation combiner 36 and pre-error input circuitry 38. More specifically, delay 32 and carrier cancellation combiner 36 operate as in a conventional feed forward amplifier such that the sampled output of the main amplifier 16 is attenuated by attenuator 40 and combined with the delayed input signal at carrier cancellation combiner 36 to substantially cancel all but the distortion component of the sampled signal from the main signal path. This carrier cancellation completes loop 1 of the feed forward amplifier. The output of carrier cancellation combiner 36 is sampled by coupler 37 and the sampled signal is provided to carrier cancellation detector 39. The detected carrier cancelled signal 41 is provided to controller 24 which uses the detected signal to control the loop 1 gain and phase adjuster settings 51, 53 to minimize the detected carrier. In some applications and implementations it may be advantageous to control the loop 1 cancellation at combiner 36 to retain some RF carrier component in the resulting signal and the resulting signal is not purely the distortion component of the main amplifier. Nonetheless, for the purposes of the present application the resulting signal will be referred to as the distortion component and it should be understood some carrier component may be included. This distortion component of the signal is provided to pre-error input circuitry 38. Pre-error input circuitry 38 may include conventional preamplifier and group delay circuitry (not shown), and gain and phase control circuitry 54, 56. Controller 24 provides loop 2 control signals 46, comprising gain adjuster settings 55 and phase adjuster settings 57, to minimize the detected pilot from pilot detector 22. Unlike the main path a predistortion circuit is typically not required in the error path due to the more linear nature of the error amplifier operation. The output of circuitry 38 is provided to error amplifier 34 which restores the magnitude of the sampled distortion components (IMDs) to that in the main signal path. The amplified distortion component output from error amplifier 34 is combined out of phase with the delayed main amplifier output at error injection coupler 42 to cancel the distortion component in the main signal path. This error cancellation completes loop 2 of the amplifier. A substantially distortion free amplified signal is then provided to the output 14.

A sample of the output signal 18 is provided by coupler 25 to pilot detector and generator circuit 22. Any residual pilot signal in the output is detected by the pilot detector circuitry 22 and provided as a pilot power signal 60. The pilot power 60 is used by the controller 24, along with the carrier cancelled signal 41, to provide control signals 44 and 46. The two controls 44, 46 may be essentially independent and may be viewed as separate control of the two loops; loop 1 comprising circuitry 20, main amplifier 16, main amplifier output sampling coupler 26, input signal coupler 30, group delay 32 and carrier cancellation combiner 36; and loop 2 comprising main amplifier sampling coupler 26, attenuator 40, carrier cancellation combiner 36, pre-error circuit 38, error amplifier 34, delay 28 and error injection coupler 42. Loop 1 control by controller 24 employs signal 41 to adjust gain and phase adjusters 50, 52 to minimize the detected carrier 41 at the output of Loop 1. Loop 2 control by controller 24 employs the detected pilot power 60 to adjust the gain and phase adjusters 54, 56 to minimize the detected pilot power 60. Suitable loop control algorithms are known to those skilled in the art and may be implemented by controller 24 which may be a suitable programmed microprocessor. Additional feed forward Loop 1 and Loop 2 control algorithms are also described in U.S. patent application Ser. No. 10/733,087 filed Dec. 11, 2003 and Ser. No. 10/733,498 filed Dec. 11, 2003, the disclosures of which are incorporated herein by reference.

Referring to FIG. 3, a preferred embodiment of the positive feedback pilot generator 22 is illustrated in a block schematic drawing. As shown the circuit comprises a detection signal path 62 and a pilot generation signal path 64. The sampled RF output 18 of the feed forward amplifier is the input to the detection path 62. (An alternative approach is to measure the output of a dynamic range extender (DRE), which provides the feed forward amplifier output with some carrier cancellation. Such a dynamic range extender is described in U.S. Pat. No. 6,147,555 issued Nov. 14, 2000, e.g., in FIGS. 14 and 15 thereof, the disclosure of which is incorporated herein by reference.) The detection portion 62 of the system preferably comprises a bandpass power detector circuit, which detects uncancelled power in a relatively narrow bandwidth portion of the sampled amplifier output 18 at a frequency outside of the RF carrier bandwidth. The bandpass power detector circuit preferably comprises a mixer 66, bandpass filter 72, and a power detector 76. IF gain stages 70, 74 may also be employed, depending on the signal strength of the sampled output 18. The RF input 18 to the detection path is down-converted to an IF frequency by Local Oscillator (LO) 68 and mixer 66. The IF signal is then bandpass filtered by filter 72 to provide a relatively narrow bandwidth signal including the pilot signal frequency. The power of this bandpass limited signal is then detected by power detector 76. Power detector 76 may comprise a log detector or RMS detector, for example. The output 60 of the power detector 76 corresponds to the residual pilot power after the second loop cancellation. This pilot power output 60 is provided to the feed forward loop controller 24 (FIG. 2).

The pilot generation circuitry 64 is preferably the reverse line-up of the bandpass power detector circuit with the addition of a limiter before the bandpass filter. The pilot generation circuit 64 preferably comprises a limiter 82, bandpass filter 84, mixer 88, and IF gain stages 80, 86. Additional or fewer IF gain stages may be employed, depending on signal strength. The pilot generation circuit 64 uses the bandpass filtered IF signal 78 from the detection path 62 as an input. The signal 78 is amplified by IF gain stage 80 then passed through limiting circuit 82 that clips the amplitude of the signal when the signal is above a threshold level. The limited signal is bandpass filtered by filter 84 then up-converted to RF by mixer 88 and LO 68, after a second IF gain stage 86 (if necessary).

The above-mentioned limiter 82 limits the amplitude of the pilot. The limiter 82 may be a device that reduces the amplitude of a signal exceeding a threshold or a nonlinear device that saturates when driven by a high level signal. Saturation, or gain reduction with increasing signal level, occurring in other parts within the pilot generator 64, such as the second multiplier 88 or IF gain stages 80, 86, may also provide a means of limiting.

The same LO 68 frequency is preferably used for both the pilot detection down-conversion at mixer 66 and the pilot generation up-conversion at mixer 88. The frequency of LO 68 is chosen to place the pilot signal outside of the bandwidth of the RF carrier of the input signal to the feed forward amplifier and to facilitate detection of the signal in circuit 62. Also, a suitable choice of LO frequency may allow a relatively inexpensive IF filter 72 to be employed. For example, a LO frequency of about 85 MHz frequency shift from the carrier band will allow an inexpensive SAW filter to be used, e.g. with a 5 MHz pass band. Various other choices of LO frequency and filter passband are also possible, however.

In operation, the pilot detection and generation circuit 22 creates a narrow bandwidth, positive feedback loop through the main amplifier 16 and the second loop of the feed forward amplifier (FIG. 2). When combined with the limiting circuit 82, a limit-cycle oscillation will develop using noise present in the feed forward amplifier and the pilot system, assuming that the loop has sufficient gain. The cancellation of the second loop affects the gain and phase of the positive feedback loop. As a result, good alignment of the second loop will suppress the limit-cycle oscillation. The degree of alignment required to suppress the limit cycle is selectable based on the amount of IF gain provided by the IF gain stages preceding the limiter 82 or by adjusting the clipping threshold of limiter 82.

A number of modifications of the illustrated implementation of the positive feed back pilot generation circuit 22 are possible. For example, an implementation of the bandpass power detector circuit 62 may employ an RF filter which is placed before the mixer 66 to reject image frequencies. In such an approach, a similar RF filter is preferably included within the pilot generation path 64 after the mixer 88. Also, it is possible to eliminate the bandpass filter 84 within the pilot generation path 64. However, such an implementation without filter 84 may not be preferred since it will waste pilot energy by producing signal components that are not detectable by the bandpass power detector circuit 62. These additional spectral components will be attenuated by the second loop cancellation as part of the feed forward compensation. Also, as noted above, the number of IF gain stages, the threshold of limiter 82, the LO frequency and the filter passband bandwidth may all be varied in accordance with the particular implementation and the particular RF carrier being amplified.

From the foregoing it will be appreciated that the present invention provides a number of advantages over prior approaches. As discussed above, prior approaches to pilot generation and detection must contend with various problems. First, there is a phase offset between the circuitry modulating and demodulating the pilot. As a result, it is necessary to compute the quadrature terms of the detected pilot in order to obtain a reliable estimate of the pilot power. Second, the pilot is 'always on' in order to measure the second loop alignment, even when the second loop is almost aligned fully. As a result, the residual pilot can appear at the output of the feed forward amplifier as a spectral spur. Third, the pilot power consumes part of the rated power handling capability of the main and error amplifiers. As a result, larger transistors are required to meet customer specifications, which in turn increases the cost.

In accordance with the present invention a pilot generation and detection system is disclosed which is based on a bandpass power detector circuit and positive feedback. The operation of the positive feedback pilot generation has many advantages, solving the above-mentioned problems in a simple, inexpensive, and novel manner.

More specifically, with respect to the quadrature detection problem experienced by the prior art, the LO phase alignment is achieved automatically within the present system by adjusting the frequency of the pilot, exploiting the delay around the feedback loop. The frequency adjustment is a by-product of the positive feedback. That is, the maximum loop gain producing the desired phase alignment will be sought as a natural mode of the system. As a result, the pilot power is measured directly as a scalar value, not requiring additional digital signal processing to transform quadrature components into power. The bandpass filters in the detection and generation paths limit the range of frequencies that the pilot system will generate.

The pilot system of the present invention has an additional benefit: the pilot turns off when the alignment is complete and turns back on if the alignment degrades subsequently. The 'on and off' feature of the pilot system is a by-product of the positive feedback and the limiter within the generation path. When the misalignment of the second loop is large, the pilot will have nearly constant amplitude. This is due to the limiter placed in the generation path. The variations in the pilot amplitude will be due primarily to the bandpass filter placed after the limiter. As the alignment of the second loop improves, the detected pilot decreases. Once the detected value drops sufficiently low so that the limiter no longer clips the amplitude within the generation path, the pilot power falls rapidly. As a result, the pilot will turn off because the second loop cancellation has reduced the loop gain so low that it cannot sustain the limit-cycle oscillation. However, if the second loop becomes misaligned, the pilot signal will return automatically. As a result of this "on and off" feature, a higher power pilot signal may be generated without negatively affecting amplifier performance. For example, a 10 dB stronger pilot signal than is conventionally used may be generated. This provides better pilot signal detection and more robust loop control.

In summary, the novel pilot signal generation system of the present invention is simple, inexpensive, robust, and better performance is obtained at lower costs.

A preferred embodiment of the present invention of an RF power amplifier design which provides an improved pilot tone generation technique has been described in relation to the various figures. Nonetheless, it will be appreciated by those skilled in the art that a variety of modifications and additional embodiments are possible within the teachings of the present invention. For example, a variety of specific pilot generation circuit implementations may be provided employing the teachings of the present invention and limitations of space prevent an exhaustive list of all the possible circuit implementations or an enumeration of all possible control implementations. A variety of other possible modifications and additional embodiments are also clearly possible and fall within the scope of the present invention. Accordingly, the described specific embodiments and implementations should not be viewed as in any sense limiting in nature and are merely illustrative of the present invention.

What is claimed is:

1. A feed forward amplifier, comprising:
an RF input for receiving an RF signal;
a main amplifier receiving and amplifying said RF signal;
a main amplifier output sampling coupler;
a first delay coupled to the RF input and providing a delayed RF signal;
a carrier cancellation combiner coupling the delayed RF signal to the sampled output from the main amplifier;
an error amplifier receiving and amplifying the output of the carrier cancellation combiner;
a second delay coupled to the output of the main amplifier;
an error injection coupler combining the output from the error amplifier and the delayed main amplifier output from the second delay so as to cancel distortion introduced by the main amplifier;
an RF output coupled to the error injection coupler output and providing an amplified RF signal;
an output sampling coupler for providing a sampled output of the amplified RF signal; and
a positive feedback pilot generator circuit for generating a pilot signal from the sampled output of the amplified RF signal and providing the pilot signal to the input of the main amplifier, wherein said positive feedback pilot generator circuit comprises a bandpass power detector for detecting signal components other than said RF input signal and a pilot generator circuit coupled to the bandpass power detector.

2. A feed forward amplifier as set out in claim 1, wherein said positive feedback pilot generator circuit further comprises a local oscillator coupled to said bandpass power detector and said pilot generator circuit.

3. A feed forward amplifier as set out in claim 2, wherein said bandpass power detector comprises a first multiplier coupled to said local oscillator and a first filter coupled to the output of said multiplier.

4. A feed forward amplifier as set out in claim 3, wherein said pilot generator circuit comprises a limiter coupled to an output of the bandpass power detector and a second multiplier coupled to the local oscillator and receiving the output of the limiter, wherein the output of the second multiplier is provided as said pilot signal.

5. A feed forward amplifier as set out in claim 3, wherein said bandpass power detector further comprises a power detector circuit for detecting the power of the signal output from said first filter and providing the detected power as a pilot power signal.

6. A feed forward amplifier as set out in claim 5, wherein said power detector circuit is a log detector circuit or an RMS detector circuit.

7. A feed forward amplifier as set out in claim 5, further comprising a controller and wherein the detected pilot power signal is provided to said controller.

8. A feed forward amplifier as set out in claim 7, further comprising a phase adjuster and a gain adjuster coupled between the carrier cancellation combiner and the error amplifier, wherein said controller controls the gain or phase adjuster based on said pilot power signal.

9. A feed forward amplifier as set out in claim 7, further comprising a predistortion circuit coupled between the RF input and the main amplifier.

10. A pilot detection and generation system adapted for use with an RF amplifier having an output, comprising:
a bandpass power detector circuit for detecting a signal component representative of a band limited portion of the amplifier output and deriving a signal representative of the detected signal power; and
a pilot generator circuit coupled to said detector circuit for generating a pilot signal from the detected signal component representative of a band limited portion of the amplifier output.

11. A pilot detection and generation system as set out in claim 10, further comprising a local oscillator coupled to said bandpass power detector circuit and said pilot generator circuit.

12. A pilot detection and generation system as set out in claim 11, wherein said bandpass power detector circuit comprises a multiplier coupled to said local oscillator so as to mix a sample of the amplifier output and the local oscillator signal.

13. A pilot detection and generation system as set out in claim 12, wherein said bandpass power detector circuit further comprises a bandpass filter coupled to the multiplier and providing a band limited output signal representative of the sampled amplifier output.

14. A pilot detection and generation system as set out in claim 13, wherein said bandpass power detector circuit further comprises a signal power detector coupled to said multiplier and receiving said band limited output and providing a signal representative of uncancelled pilot power in the amplifier output.

15. A pilot detection and generation system as set out in claim 14, wherein said power detector circuit is a log detector.

16. A pilot detection and generation system as set out in claim 14, wherein said power detector circuit is an RMS detector.

17. A pilot detection and generation system as set out in claim 13, wherein said pilot generator circuit receives the output from said bandpass filter.

18. A pilot detection and generation system as set out in claim 17, wherein said pilot generator circuit further comprises a multiplier coupled to said local oscillator and mixing the local oscillator signal with said band limited signal and providing the output of the multiplier as said pilot signal.

19. A pilot detection and generation system as set out in claim 14, wherein said bandpass power detector circuit further comprises a gain stage to provide a gain to the signal from the multiplier.

20. A pilot detection and generation system as set out in claim 19, wherein the gain stage is provided before the bandpass filter.

21. A pilot detection and generation system as set out in claim 19, wherein the gain stage is provided after the bandpass filter.

22. A pilot detection and generation system as set out in claim 17, wherein said pilot generator circuit comprises a gain stage to provide a gain to the signal received from the bandpass power detector circuit.

23. A pilot detection and generation system as set out in claim 22, wherein said pilot generator circuit further comprises a bandpass filter and said gain stage is configured before said bandpass filter.

24. A pilot detection and generation system as set out in claim 22, wherein said pilot generator circuit further comprises a bandpass filter and said gain stage is configured after said bandpass filter.

25. A pilot detection and generation system as set out in claim 17, wherein said pilot generator circuit comprises a limit circuit for limiting the maximum signal strength of the pilot signal.

26. A method for generating a pilot signal from the output of an RF amplifier, comprising:
    detecting a signal representative of a band limited sample of an amplifier output; and
    generating a pilot signal derived from said signal representative of a band limited sample of said amplifier output.

27. A method as set out in claim 26, wherein said detecting a signal comprises sampling an RF output signal from said amplifier and down converting the output signal to an intermediate frequency.

28. A method as set out in claim 27, wherein said down converting comprises mixing the sampled RF output signal with a local oscillator signal.

29. A method as set out in claim 27, wherein said detecting a signal comprises band limiting the down converted signal to a frequency band outside the frequency band of the down-converted RF carrier signal in said amplifier output.

30. A method as set out in claim 29, wherein said detecting a signal further comprises amplifying the band limited signal.

31. A method as set out in claim 29, wherein said detecting a signal further comprises detecting the power of the band limited signal.

32. A method as set out in claim 26, wherein said generating a pilot signal comprises providing a gain to the signal representative of a band limited sample of the amplifier output.

33. A method as set out in claim 32, wherein said generating a pilot signal comprises clipping the gain adjusted signal.

34. A method as set out in claim 33, wherein said generating a pilot signal comprises bandpass filtering the gain adjusted signal.

35. A method as set out in claim 34, wherein said generating a pilot signal further comprises gain adjusting the bandpass filtered signal.

36. A method as set out in claim 34, wherein said generating a pilot signal further comprises mixing the bandpass filtered signal with a local oscillator signal.

37. A method of controlling an amplifier, comprising:
    sampling an output of the amplifier;
    bandpass filtering said sampled signal to provide a band limited signal;
    generating a pilot signal derived from the band limited signal;
    injecting said pilot signal into a signal path of the amplifier;
    detecting any residual pilot signal in said sampled signal; and
    controlling at least one of the gain and phase of a signal path in the amplifier in response to said detected pilot signal.

38. A method for amplifying an RF input signal having an RF carrier with a carrier bandwidth, comprising:
    receiving an RF input signal;
    amplifying said RF input signal employing a main amplifier;
    sampling the main amplifier output;
    delaying the RF input signal and providing a delayed RF input signal;
    coupling the delayed RF input signal to the sampled output from the main amplifier so as to provide a distortion component of said sampled output from the main amplifier;
    amplifying the distortion component employing an error amplifier;
    delaying the output of the main amplifier;
    combining the amplified distortion component and the delayed output of the main amplifier so as to cancel distortion introduced by the main amplifier and providing an amplified RF output;
    sampling the amplified RF output to provide a sampled output;
    band limiting the sampled output to a frequency band outside the RF carrier band;
    generating a pilot signal from the band limited signal and injecting the pilot signal as an input to the main amplifier;
    detecting any residual pilot signal in the sampled output; and
    controlling at least one of the gain or phase of the signal input to the error amplifier in response to the detected pilot signal.

* * * * *